Figure 1:
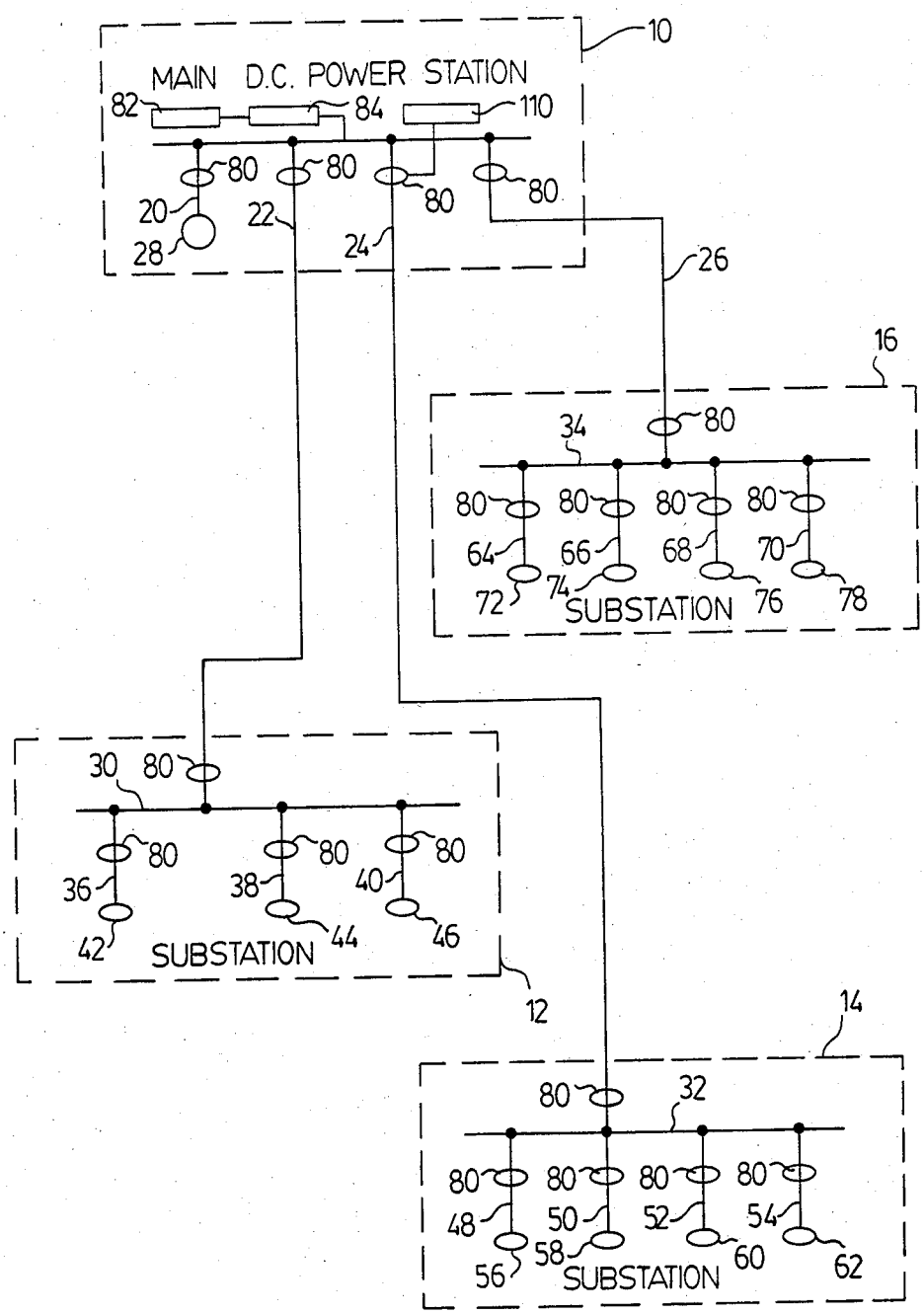

United States Patent [19]

MacPhee et al.

[11] Patent Number: 4,638,245
[45] Date of Patent: Jan. 20, 1987

[54] DETECTION OF GROUND FAULTS IN UNGROUNDED DC POWER SUPPLY SYSTEMS

[75] Inventors: Colin A. A. MacPhee, Scarborough; Ohjhong Yoon, Markham, both of Canada

[73] Assignee: Federal Pioneer Limited, Toronto, Canada

[21] Appl. No.: 689,698

[22] Filed: Jan. 8, 1985

[30] Foreign Application Priority Data

Sep. 27, 1984 [CA] Canada .................................. 464177

[51] Int. Cl.⁴ ............................................. G01R 31/02
[52] U.S. Cl. ................................................. 324/51
[58] Field of Search ................... 324/51, 52; 340/651, 340/650; 361/45, 93

[56] References Cited

U.S. PATENT DOCUMENTS

| | | | |
|---|---|---|---|
| 2,529,126 | 11/1950 | Barnes | 324/51 |
| 3,218,622 | 11/1965 | Gardner | 340/651 |
| 3,274,489 | 9/1966 | Behr | 324/52 |
| 3,754,221 | 8/1973 | Stelter | 340/651 |

Primary Examiner—Stanley T. Krawczewicz
Attorney, Agent, or Firm—Robert F. Delbridge; Arne I. Fors

[57] ABSTRACT

An apparatus for detecting a ground fault in an ungrounded DC power supply system having a DC power supply connected by positive and negative lines to a load, an AC voltage is selectively applied between a positive line and ground or between a negative line and ground. A current sensor including an electrical coil surrounding the positive and negative lines is responsive to significant alternating current in one of the lines, when the AC voltage is applied to the line and the line has a ground fault, to thereby indicate the fault.

9 Claims, 16 Drawing Figures

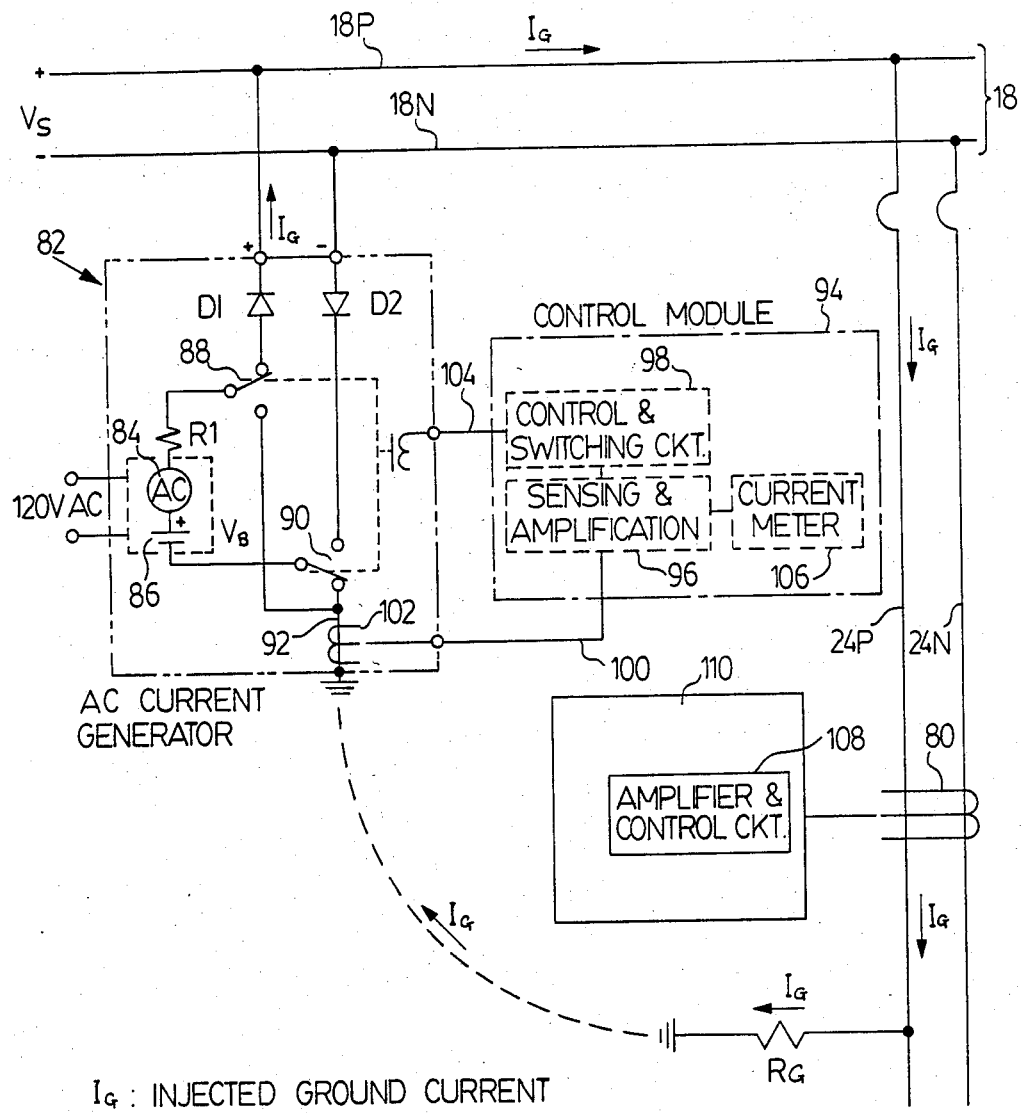

DETECTION OF GROUND FAULTS IN UNGROUNDED DC POWER SUPPLY SYSTEMS

This invention relates to the detection of ground faults in ungrounded DC power supply systems, for example power distribution systems in which DC power is supplied through positive and negative lines to various loads.

DC power distribution systems are used in industry for certain purposes, for example where speed control of motors is desired such as in steel mills and rolling mills, and in electrolytic processes such as copper or aluminum production or electro-galvanizing of steel strip. To avoid shutting down such operations if a ground fault occurs, the DC power supply system is usually operated ungrounded so that the first ground fault occurring has no effect other than to convert the system to a grounded system, thus removing the advantages of the ungrounded mode.

However, since ground faults are common on such systems, it is desirable not only to be able to quickly detect the occurrence of a ground fault, but also quickly identify the location of the fault. Although various ground faults detecting equipment for DC power supply systems has been proposed, such equipment has for various reasons not been particularly satisfactory in practice.

It is therefore an object of the invention to provide apparatus for detecting a ground fault in a DC power supply system which enables the presence and location of a ground fault to be readily ascertained.

According to the invention, ground fault detection apparatus comprises means for applying an AC voltage selectively between a positive line and ground or between a negative line ground, and current sensing means comprising a electrical coil surrounding said positive and negative lines and responsive to significant alternating current in one of said lines, when said AC voltage is applied to said one line and said one line has a ground fault, to thereby indicate said fault.

Thus, if a ground fault occurs, the alternating current flow in the fault line will be significantly more than the alternating current flow in the other line. In view of this imbalance in current flow, a significant current will be induced in the sensing coil surrounding the lines, thereby indicating the presence of the fault. By locating such current sensing means at different locations in the DC powered distribution system, the location of the fault can also be readily ascertained.

The AC voltage applying means may comprise an AC voltage source selectively connectable through a first one-way current passing device to the positive line or through a second one-way current passing device to the negative line. Each one-way current passing device may comprise a diode.

The AC voltage applying means may also comprise a DC bias voltage source not less than the peak voltage of the AC voltage source. The sum of the DC bias voltage source and the peak voltage of the AC voltage source is preferably not greater than the voltage of the DC power supply. Advantageously, the DC bias voltage is about half the voltage of the DC power supply.

The apparatus may also include current sensing means operable to sense ground current between the AC voltage applying means and ground to indicate total AC ground current in the system.

Figure 3A:
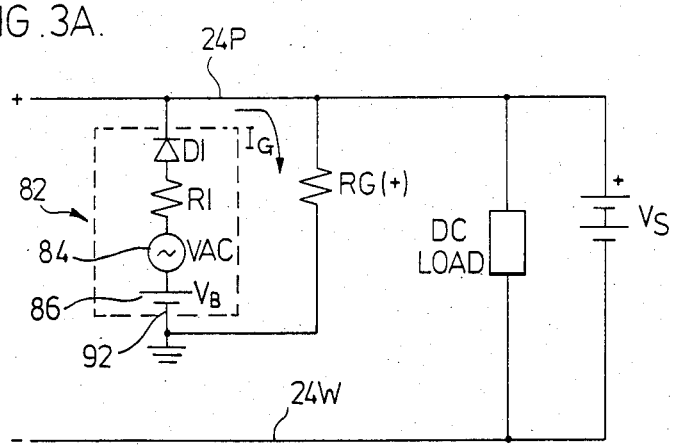
Figure 3B:
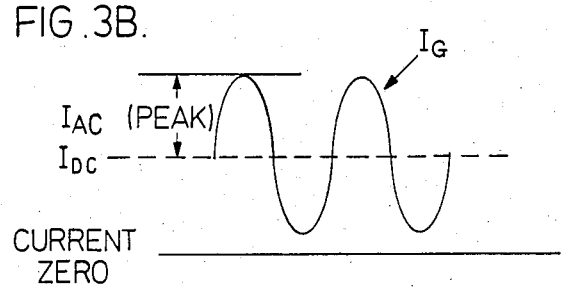
Figure 3C:
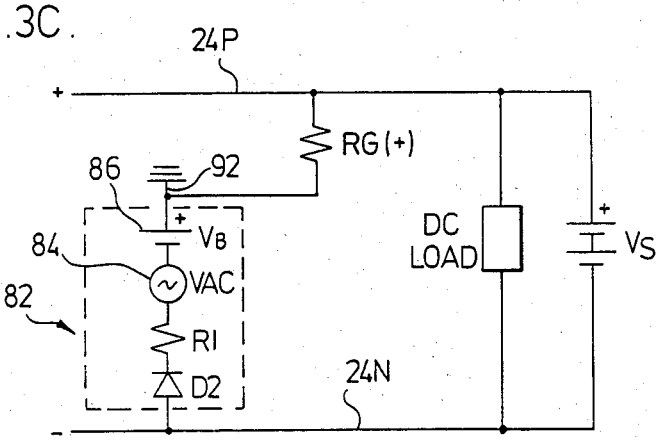
Figure 4A:
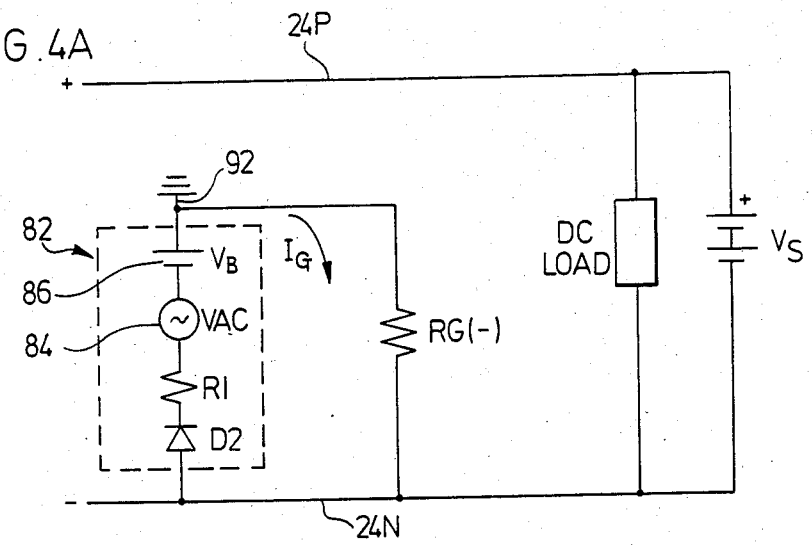
Figure 4B:
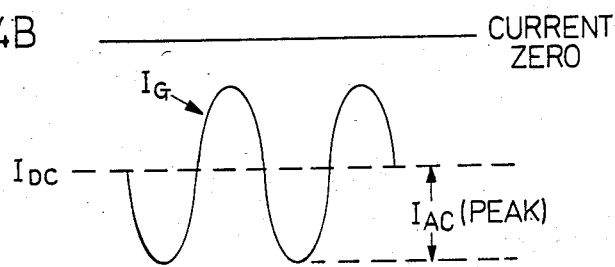
Figure 4C:
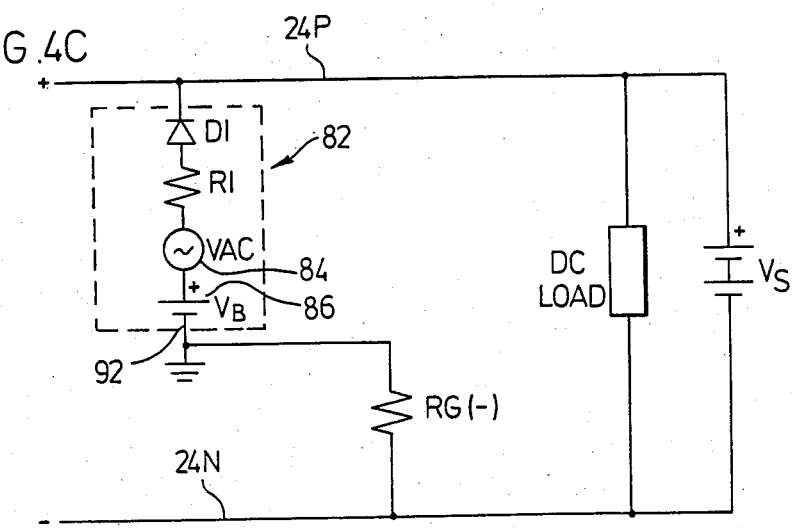
Figure 5A:
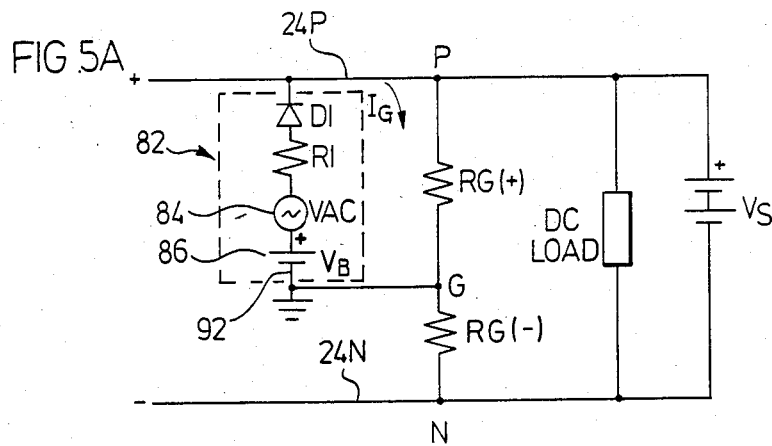
Figure 5B:
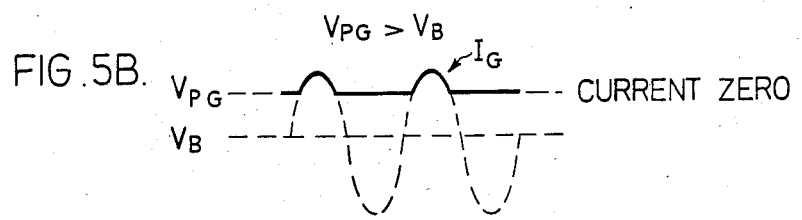
Figure 5C:
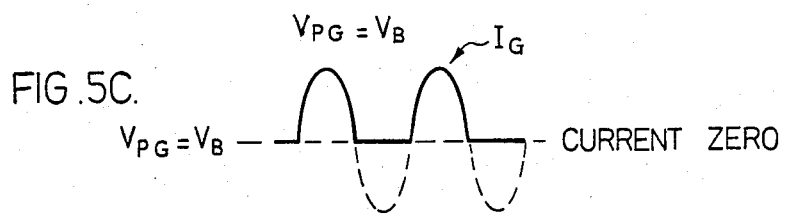
Figure 5D:
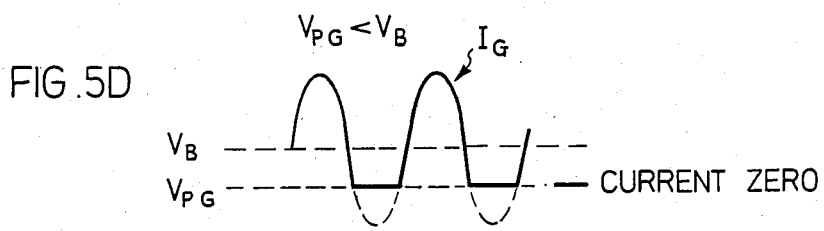
Figure 6A:
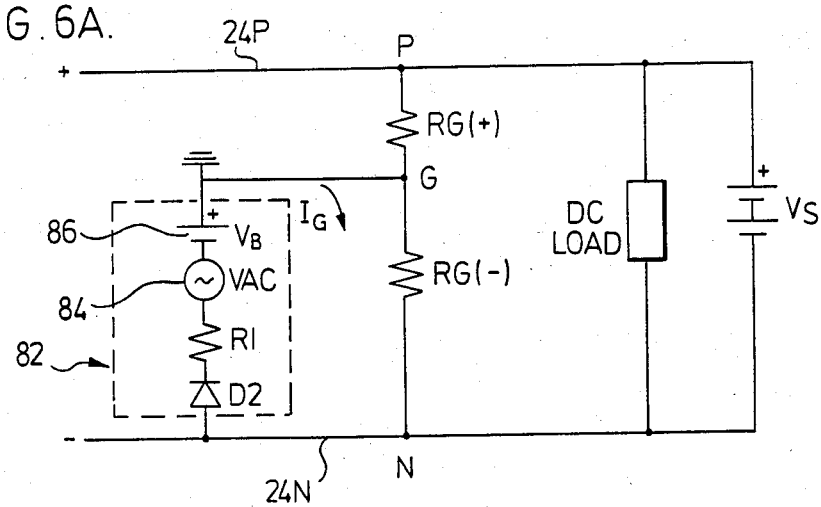
Figure 6B:
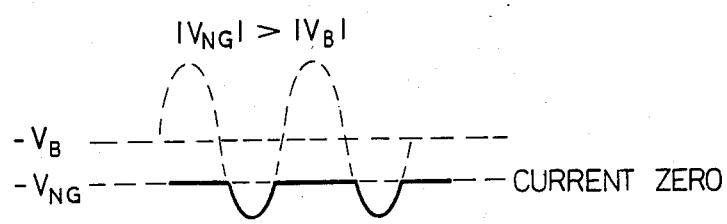
Figure 6C:
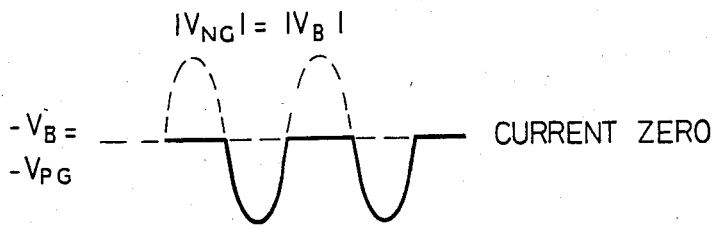
Figure 6D:
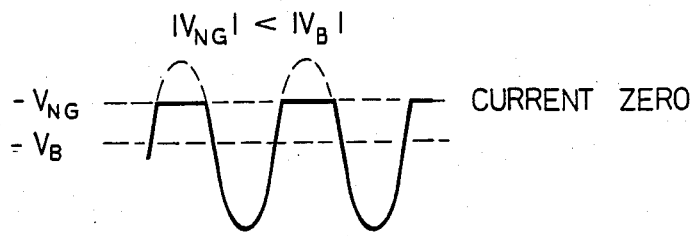

One embodiment of the invention will now be described, by way of example, with reference to the accompanying drawings, of which:

FIG. 1 is a diagrammatic view of a DC power distribution system showing the location of current sensors in accordance with the present invention, FIG. 2 is a circuit diagram showing the circuit for applying AC voltage alternately to the positive and negative lines of a DC system, FIG. 3A shows the effective circuit when a ground fault occurs in the positive line and the AC voltage is applied thereto, FIG. 3B shows the current waveform in the circuit of FIG. 3A, FIG. 3C shows the effective circuit when a ground fault occurs in the positive line and the AC voltage is applied to the negative line, FIG. 4A shows the effective circuit when a ground fault occurs in the negative line and the AC voltage is applied thereto, FIG. 4B shows the current waveform in the circuit of FIG. 4A, FIG. 4C shows the effective circuit when a ground fault occurs in the negative line and the AC voltage is applied to the positive line, FIG. 5A shows the effective circuit when a ground fault occurs in both the positive line and the negative line, and the AC voltage is applied to the positive line, FIGS. 5B to 5D show the current waveforms under various conditions in the circuit of FIG. 5A, FIG. 6A shows the effective circuit when a ground fault occurs in both the positive and the negative line and the AC voltage is applied to the negative line, and FIGS. 6B to 6D show the current waveforms under various conditions in the circuit of FIG. 6A.

Referring to the drawings, FIG. 1 shows a DC power distribution system having a main DC power station 10 with three sub-stations 12, 14, 16. For simplicity in FIG. 1, positive and negative supply lines are shown as a single line. The main DC power station has a bus 18 with four sets of feeder lines 20, 22, 24, 26. Lines 20 are connected to a load 28 at the main power station 10, and lines 22, 24, 26 are connected to buses 30, 32, 34 at the sub-stations 12, 14, 16 respectively. Bus 30 in sub-station 12 has three sets of feeder lines 36, 38, 40 connected to loads 42, 44, 46. Bus 32 in sub-station 14 has four sets of feeder lines 48, 50, 52, 54 connected to loads 56, 58, 60, 62. Bus 34 in substation 16 has four feeder lines 64, 66, 68, 70 connected to loads 72, 74, 76, 78.

In accordance with the invention, a series of current sensors 80 are located at suitable positions in the system as indicated in FIG. 1, each sensor 80 surrounding a pair of positive and negative supply lines. AC voltage is supplied alternately to the positive and negative lines of main bus 18 in the power station 10, as will be described in more detail later. In a normal operation of the system there will be an insignificantly low ground current from various parts of the systems back to the AC voltage in the main power station 10. Thus, no AC current will be detected by the sensors 80.

If, for example, a ground fault occurs in line 50 load 58 in sub-station 14, three sensors 80 will respond to indicate the presence of the fault, namely sensor 80 on lines 24, near main bus 18, sensor 80 on lines 24, near substation 14, and sensor 80 on lines 50 near bus 32. Thus, the presence of the fault is simultaneously indicated in the main power station 10 and in the sub-station 14, and the sensors 80 in sub-station 14 indicate that the location of the fault is in lines 50 or load 58. If only sensor 80 on lines 24 near main bus 18 indicates a fault, without any sensors 80 in sub-station 14 being actuated, then the fault would be in line 24 and not in sub-station 14. The actual line, positive or negative, in which the fault is located is ascertained when the AC voltage is applied to that line.

FIG. 2 shows the AC current generator 82 for supplying AC voltage alternately to the positive and negative lines 18P, 18N of main bus 18 in power station 10. For simplicity only one current sensor 80 is shown, namely the sensor 80 in main power station 10 associated with positive and negative lines 24P, 24N feeding sub-station 14. The AC current generator 82 has a 120 V AC source 84 (with adjustable voltage) and a DC bias voltage source 86. Bis voltage $V_B$ is about half the supply voltage $V_S$ of the DC power distribution system. The peak voltage of the AC source 84 is arranged to be not greater than the bias voltage $V_B$. The positive side of bias voltage source 86 is connected through AC voltage source 84 and current limiting resistor R1 to a first two-way switch 88, which in the position shown in FIG. 2 connected the biased AC voltage through a first diode D1 to main bus positive line 18P. The negative side of bias voltage source 86 is connected to a second two-way switch 90, which in the position shown in FIG. 2 connects the biased AC voltage to grounded line 92.

In the other position of switch 88, the positive side of bias voltage source 86 is connected through AC voltage source 84 and resistor R1 to grounded line 92 which is the other position of switch 90, the negative side bias voltage source 86 is connected through a second diode D2 to main bus negative line 18N. The injected alternating current is in effect a pulsating DC, either in the positive or negative polarizing curve. When there is no ground fault in the system, the diodes D1 and D2 provide complete isolation between the AC current generator 82 and the DC power system.

The AC current generator 82 is controlled by a control module 94 which includes a sensing and activating circuit 96 and a control and switching circuit 98. The sensing and actuating circuit 96 is connected by a line 100 to a current sensor coil 102 surrounding grounded line 92 in AC current generator 82. Control and actuating circuit 98 operate to cause switches 88, 90 to alternate between the positions shown in FIG. 2 and the other positions as described to alternately supply the biased AC voltage to main bus lines 18P and 18N. For example, such alternation may be arranged to occur every fifteen, thirty or sixty seconds as selected, or may be controlled manually.

If there is a ground fault for example in line 24P, as indicated by resistor $R_G$ in FIG. 2, ground current $I_G$ will flow when switches 88, 90 are in the position shown in FIG. 2, i.e. when the biased AC voltage is connected to main bus positive line 18P and hence also to line 24P. Ground current $I_G$ is detected by the induction of a significant current in sensor 102, and such current is sensed and indicated by sensing and actuating circuit 96. The resultant signal may actuate a current meter 106.

Ground current $I_G$ is also detected by sensor 80 surrounding lines 24P, 24N. The ground current $I_G$ induces a significant current in the sensor coil, and such current is supplied to an amplifier and control circuit 108 in an associated feeder module 110.

The nature of sensing and amplification circuit 96, control and switching circuit 98 and amplification and control circuit 108 will readily be apparent to a person skilled in the art and hence need not be described in further detail.

Thus, the DC power distribution system is periodically monitored, with such monitoring applying the biased AC voltage alternately to the positive and negative lines of the system, so that any ground fault is readily detected and its location ascertained. The control module also has provision for manually operation of the AC current generator 82 if desired, i.e. AC source 84 can be actuated and the switches 88, 80 operated by manual control.

FIGS. 3A and 3B show the effective circuit and current waveform when a ground fault occurs in the positive line 24P and the AC current generator 82 is connected thereto. The direct current $I_{DC}$ flowing through ground fault resistor $R_{G(+)}$ due to bias voltage $V_B$ is $$I_{DC} = \frac{V_B}{R1 + R_{G(+)}}$$

The alternating current $I_{AC}$ flowing through ground fault resistance $R_{G(+)}$ due to the AC voltage $V_{AC}$ is $$I_{AC} = \frac{V_{AC}}{R1 + R_{G(+)}}$$

The total current $I_G$ flowing through ground fault resistance $R_{G(+)}$ is $I_{DC}+I_{AC}$ as shown in FIG. 3B. Since bias voltage $V_G$ is greater than peak $V_{AC}$, $I_G$ is never cut off by diode D1 but varies sinusoidally in line 24P and hence is detected by sensor coil 80.

If the same fault in positive line 24P is present when AC current generator 82 is connected to negative line 24N as shown in FIG. 3C, then $I_G=0$ provided that system voltage $V_S$ is greater than bias voltage $V_B$ plus peak AC voltage $V_{AC}$, since diode D2 is therefore always reverse biased. Thus, sensor coil 80 is not actuated, thereby clearly indicating that the fault is in the positive line 24P. Thus, no AC current is passed through the DC load.

FIGS. 4A and 4B show the effective circuit and current waveform when a ground fault occurs in the negative line 24N and the AC current generator 82 is connected thereto. The direct current $I_{DC}$ flowing through ground fault resistance $R_{G(-)}$ due to bias voltage $V_B$ is $$I_{DC} = \frac{V_B}{R1 + R_{G(-)}}$$

The alternating current $I_{AC}$ flowing through ground fault resistance $R_{G(-)}$ due to AC voltage $V_{AC}$ is $$I_{AC} = \frac{V_{AC}}{R1 + R_{G(-)}}$$

The total current $I_G$ flowing through ground fault resistance $R_{G(-)}$ is $I_{DC}+I_{AC}$ as shown in FIG. 4B. Since bias voltage $V_B$ is greater than peak $V_{AC}$, $I_G$ is never cut off by diode D2 but varies sinusoidally in negative line 24N and hence is detected by sensor coil 80.

If the same fault in negative line 24N is present with AC current generator 82 connected to positive line 24P as shown in FIG. 4C, then $I_G=0$ provided that (as before) system voltage $V_S$ is greater than bias voltage $V_B$ plus peak AC voltage $V_{AC}$, since diode D1 is therefore always reverse biased. Thus, sensor coil 80 is not actuated, thereby clearly indicating that the fault is in the negative line 24N. Again, no AC current passes through the DC load.

FIG. 5A shows the effective circuit when a ground fault occurs in both positive and negative lines 24P, 24N, and the AC voltage is applied to the positive line 24P. The current $I_G$ flowing through ground fault resistance $R_{G(+)}$ depends upon the relative magnitudes of the ground faults. If the voltage $V_{PG}$ across ground fault resistance $R_{G(+)}$ is greater than bias voltage $V_B$, then $I_G$ is as shown in FIG. 5B. If voltage $V_G$ is equal to bias voltage $V_B$, then $I_G$ is as shown in FIG. 5C, and if voltage $V_{PG}$ is less than bias voltage $V_B$, then $I_G$ is as shown in FIG. 5B. Thus, in each case, current $I_G$ through line 24P varies in such a manner as to produce a response in sensor coil 80.

FIGS. 6A shows effective circuit when a ground fault occurs in both positive and negative lines 24P, 24N, and the AC voltage is applied to the negative line 24N. Again, the current $I_G$ following through ground fault resistance $R_{G(-)}$ depends upon the relative magnitudes of the ground faults. If voltage $V_{NG}$ across ground fault resistance $R_{G(-)}$ is greater in magnitude than bias voltage $V_B$ then $I_G$ is as shown in FIG. 6B. If voltage $V_{NG}$ is equal in magnitude to bias voltage $V_B$, then $I_C$ is as shown in FIG. 5C, and if voltage $V_{NG}$ is lower in magnitude than voltage $V_B$, then $I_G$ is as shown in FIG. 6B. Thus, in each case, current $I_G$ through line 24N varies in such a manner as to produce a response in sensor coil 80. No AC current passes through the DC load in either case.

From the foregoing description, it will be seen that the present invention enables the presence and location ground faults to be readily ascertained, including the determination of whether a fault is in the positive line or in the negative line. The ratio of the AC voltage to the AC current gives the total impedance as seen by the AC source. Thus, since other impedances in the circuit are known, the impedance of a ground fault can easily be calculated.

Other embodiments of the invention will be apparent to a person skilled in the art, the scope of the invention being defined in the appended claims.

What we claim as new and desire to protect by Letters Patent of the U.S. is:

1. Apparatus for detecting a ground fault in an ungrounded DC power supply system having a DC power supply connected by positive and negative lines to a load, comprising:
   means for applying an AC voltage selectively between a positive line and ground or between a negative line and ground, and
   current sensing means comprising an electrical coil surrounding said positive and negative lines and responsive to significant alternating current in one of said lines, when said AC voltage is applied to said one line and said one line has a ground fault, to thereby indicate said fault.

2. Apparatus according to claim 1 wherein said AC voltage applying means comprises an AC voltage source selectively connectable through a first one-way current passing device to the positive line or through a second one-way current passing device to the negative line.

3. Apparatus according to claim 2 wherein each one-way current passing device comprises a diode.

4. Apparatus according to claim 2 wherein the AC voltage applying means also comprises a DC bias voltage source not less than the peak voltage of the AC voltage source.

5. Apparatus according to claim 4 wherein the sum of the DC bias voltage source and the peak voltage of the AC voltage source is not greater than the voltage of the DC power supply.

6. Apparatus according to claim 5 wherein the DC bias voltage is about half the voltage of the DC power supply.

7. Apparatus according to claim 1 wherein a series of said current sensing means are provided at different locations along said positive and negative lines.

8. Apparatus according to claim 1 including current sensing means operable to sense ground current between said AC voltage applying means and ground to indicate total AC ground current in the system.

9. Apparatus according to claim 4 wherein the sum of the DC bias voltage source and the peak voltage of the AC voltage source is not greater than the voltage of the DC power supply, and a series of said current sensing means are provided at different locations along said positive and negative lines.

* * * * *